US012060987B2

(12) United States Patent
Namie

(10) Patent No.: US 12,060,987 B2
(45) Date of Patent: Aug. 13, 2024

(54) LIGHT-EMITTING MODULE WITH DETECTION UNIT

(71) Applicant: NICHIA CORPORATION, Anan (JP)

(72) Inventor: Takashi Namie, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/161,148

(22) Filed: Jan. 30, 2023

(65) Prior Publication Data

US 2023/0243494 A1    Aug. 3, 2023

(30) Foreign Application Priority Data

Jan. 31, 2022   (JP) ................. 2022-013501

(51) Int. Cl.

| F21V 23/04 | (2006.01) |
|---|---|
| F21V 3/06 | (2018.01) |
| F21V 5/04 | (2006.01) |
| F21V 9/20 | (2018.01) |
| F21V 9/30 | (2018.01) |
| F21Y 115/30 | (2016.01) |

(52) U.S. Cl.
CPC ........ *F21V 23/0457* (2013.01); *F21V 3/0625* (2018.02); *F21V 5/04* (2013.01); *F21V 9/20* (2018.02); *F21V 9/30* (2018.02); *F21Y 2115/30* (2016.08)

(58) Field of Classification Search
CPC .......... F21V 23/0457; F21V 9/20; F21V 9/30; F21V 3/0625; F21V 5/04
See application file for complete search history.

(56) References Cited

U.S. PATENT DOCUMENTS

| 2014/0204398 A1* | 7/2014 | Sato ................. F21S 41/148 |
|---|---|---|
| | | 356/614 |
| 2017/0290131 A1 | 10/2017 | Ito |

(Continued)

FOREIGN PATENT DOCUMENTS

| JP | 2015-141309 A | 8/2015 |
|---|---|---|
| JP | 2017-146581 A | 8/2017 |
| JP | 2017-181933 A | 10/2017 |

(Continued)

*Primary Examiner* — Elmito Breval
*Assistant Examiner* — Michael Chiang
(74) *Attorney, Agent, or Firm* — Foley & Lardner LLP

(57) ABSTRACT

A light-emitting module includes: a plurality of light-emitting elements located on a mounting surface; one or more optical members configured to control light emitted from each of the plurality of light-emitting elements, and allow output light and monitor light for controlling an output of the output light to exit; and a detection unit configured to detect the monitor light. The one or more optical members include a first optical member on which the light emitted from the plurality of light-emitting elements is incident. The plurality of light-emitting elements comprises a plurality of first light-emitting elements, which are, among the plurality of light-emitting elements, all light-emitting elements that are configured to emit light incident on the first optical member. The detection unit includes: a first condensing lens configured to condense the monitor light, and a light-receiving element configured to receive the monitor light exiting from the first condensing lens.

11 Claims, 9 Drawing Sheets

(56) References Cited

U.S. PATENT DOCUMENTS

2019/0097396 A1* 3/2019 Sakai ................ G02B 26/0833
2020/0241294 A1* 7/2020 Ichii ................... G02B 27/0101

FOREIGN PATENT DOCUMENTS

| JP | 2018-005162 A | 1/2018 |
| JP | 2019-164204 A | 9/2019 |
| JP | 2020-122858 A | 8/2020 |
| WO | WO-2021/162047 A1 | 8/2021 |

* cited by examiner

LIGHT-EMITTING MODULE WITH DETECTION UNIT

CROSS-REFERENCE TO RELATED APPLICATION

This application claims priority to Japanese Patent Application No. 2022-013501, filed on Jan. 31, 2022, the disclosure of which is hereby incorporated by reference in its entirety.

BACKGROUND

The present disclosure relates to a light-emitting module.

PCT Publication No. WO 2021/162047 discloses a technique for dividing light from a light source into transmitted light and reflected light to set the reflected light as monitor light, and controlling the light source in response to the light amount of the monitor light.

SUMMARY

A further technique may be required in order for a light-receiving element to accurately receive light, and an object of the present disclosure is to provide a light-emitting module that can achieve the accurate reception by the light-receiving element.

A light-emitting module according to the present disclosure includes: a plurality of light-emitting elements disposed on a mounting surface; one or more optical members configured to control light emitted from each of the plurality of light-emitting elements, and emit output light and monitor light for controlling an output of the output light; and a detection unit configured to detect the monitor light, wherein the one or more optical members include a first optical member on which the light emitted from the plurality of light-emitting elements is incident, a plurality of first light-emitting elements being all light-emitting elements having light incident on the first optical member are included in the plurality of light-emitting elements, the detection unit includes a first condensing lens including an incident surface on which the monitor light is incident, and being configured to condense the monitor light incident on the incident surface, and a light-receiving element including a light-receiving surface having an area smaller than an area of an incident region of the incident surface of the first condensing lens on which the monitor light is incident, and being configured to receive the monitor light emitted from the first condensing lens, and the monitor light incident on the incident region of the first condensing lens includes light obtained from light emitted from each of the plurality of first light-emitting elements.

In an embodiment according to the present disclosure, a light-receiving element can accurately receive light.

DETAILED DESCRIPTION

Figure 1:
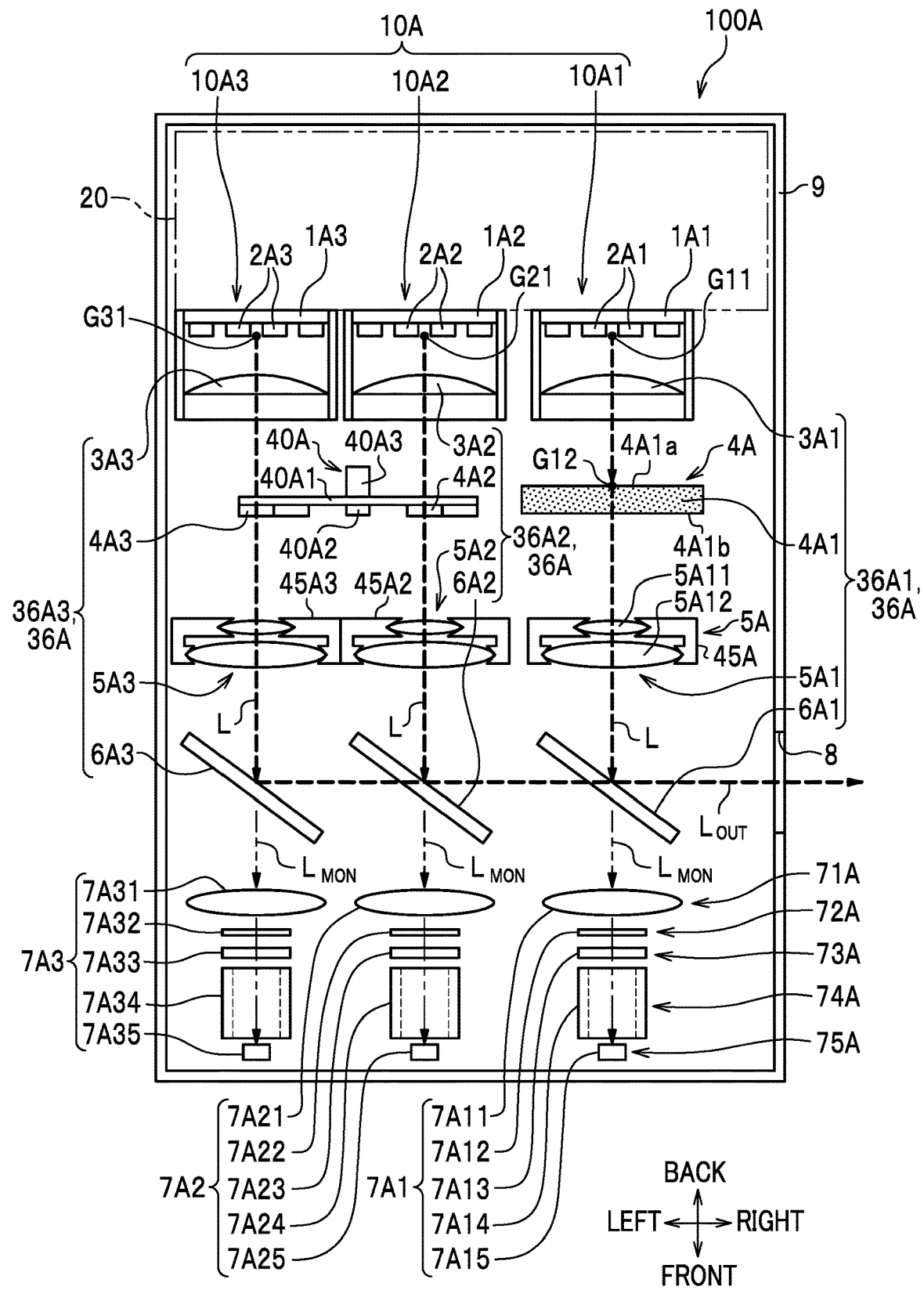
FIG. 1 is a plan view schematically illustrating the inside of a light-emitting module according to an embodiment.

The drawings referred to in the description according to the following embodiment are drawings that schematically illustrate the present disclosure, and thus scales and intervals of members, positional relationships, and the like may be exaggerated, or some of the members may not be illustrated in the drawings. Further, the scales and the intervals of the members may not be the same. Further, in the following description, members having the same terms and reference characters, in principle, represent the same members or equivalent members, and a repeated detailed description of such members will be omitted as appropriate.

In a configuration of a light-emitting module, "upper," "lower," "left," "right," and the like are interchanged according to a situation. In the present specification and claims, expressions such as "upper" and "lower" are used merely to describe a relative relationship of positions, orientations, directions, and the like, and the expressions need not necessarily match an actual relationship at a time of use.

Furthermore, in this specification or the scope of the claims, when there are a plurality of components corresponding to a certain component and each of the components is to be expressed separately, the components may be distinguished by adding ordinal numbers, such as "first" and "second," in front of the component term. Further, when objects or viewpoints to be distinguished differ between this specification and the claims, the same ordinal numbers in the specification and the claims may not refer to the same objects.

First Embodiment

Figure 2:
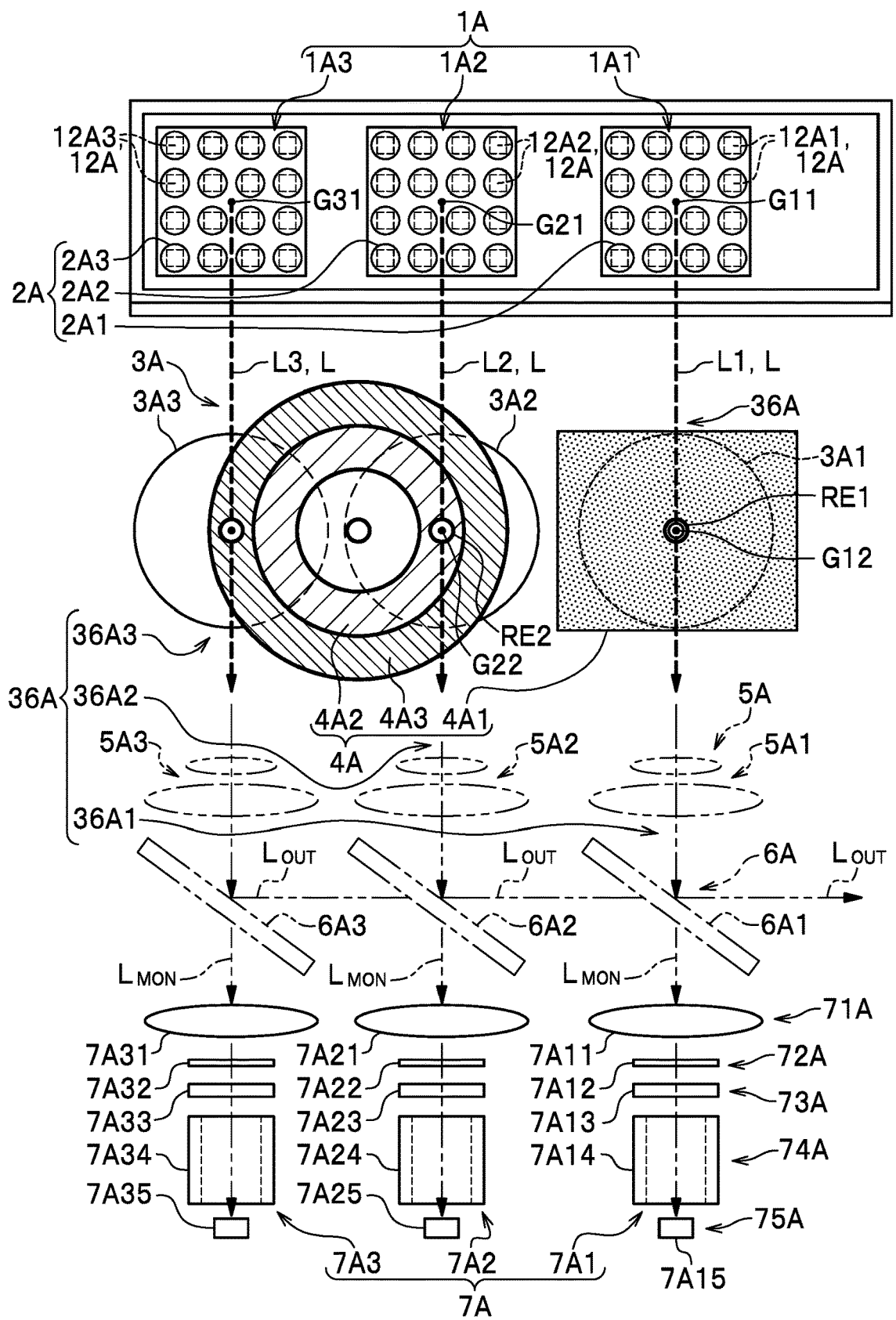
FIG. 2 is an explanatory diagram schematically illustrating each configuration of the light-emitting module according to the embodiment.
Figure 3:
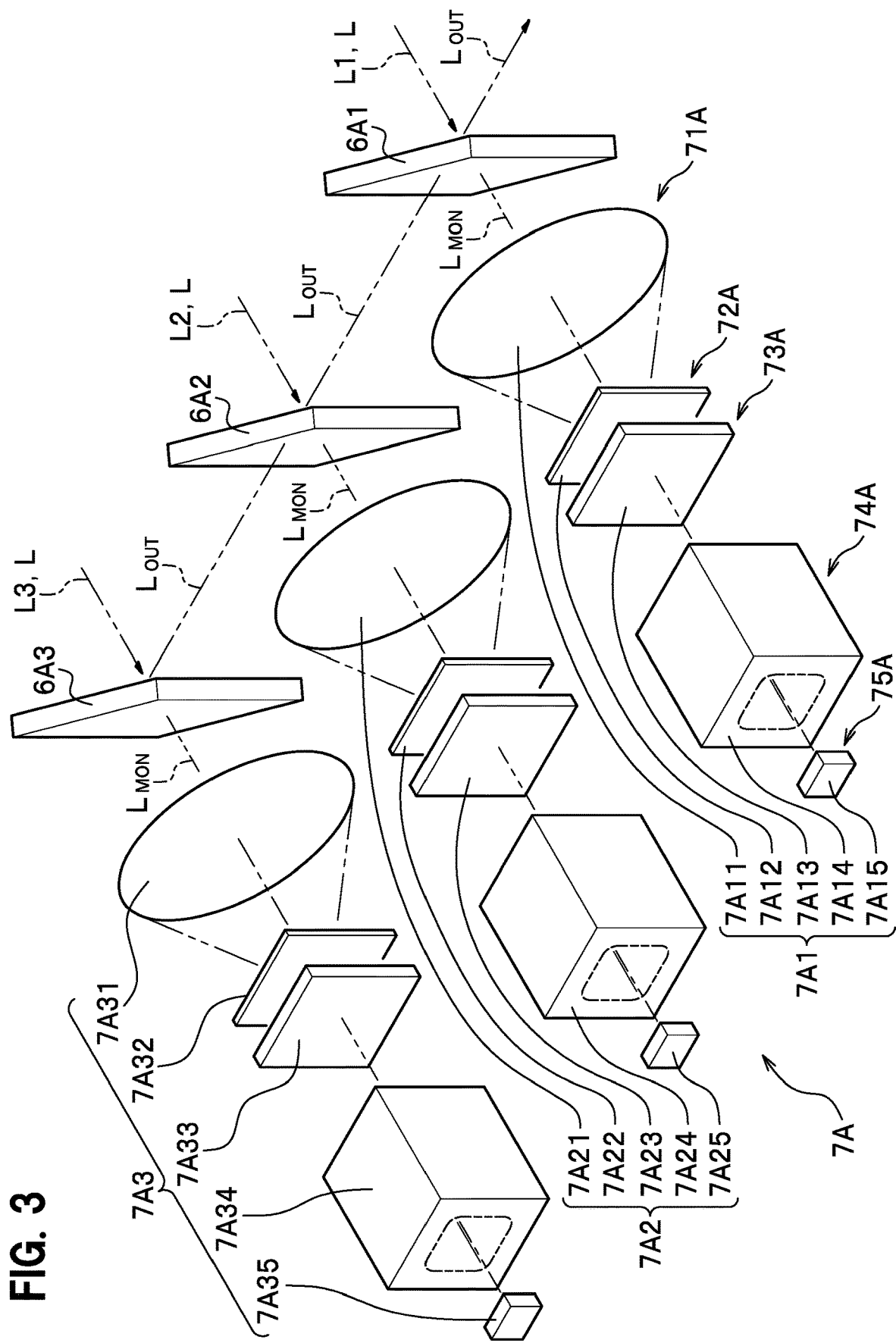
FIG. 3 is an explanatory diagram schematically illustrating a detection unit of the light-emitting module according to the embodiment.
Figure 4:
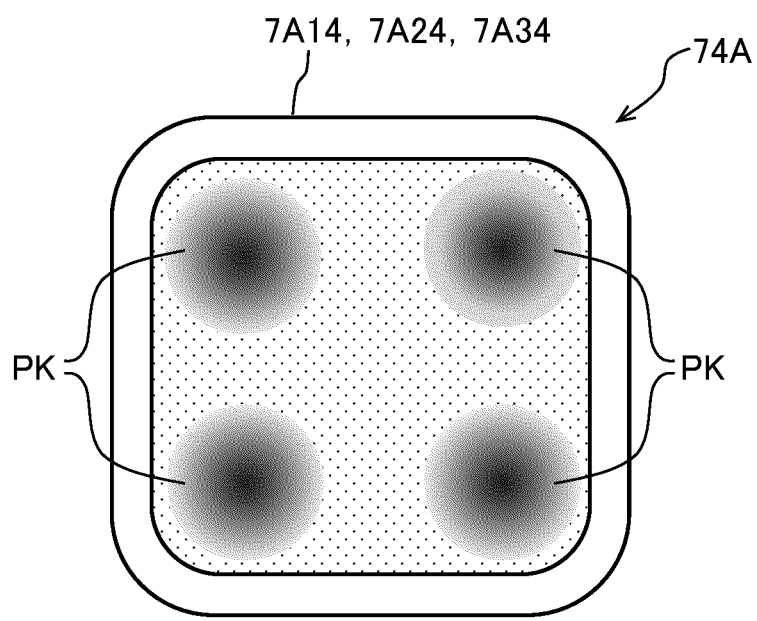
FIG. 4 is an explanatory diagram schematically illustrating a distribution of light of a rod integrator used in the detection unit of the light-emitting module according to the embodiment.
Figure 5:
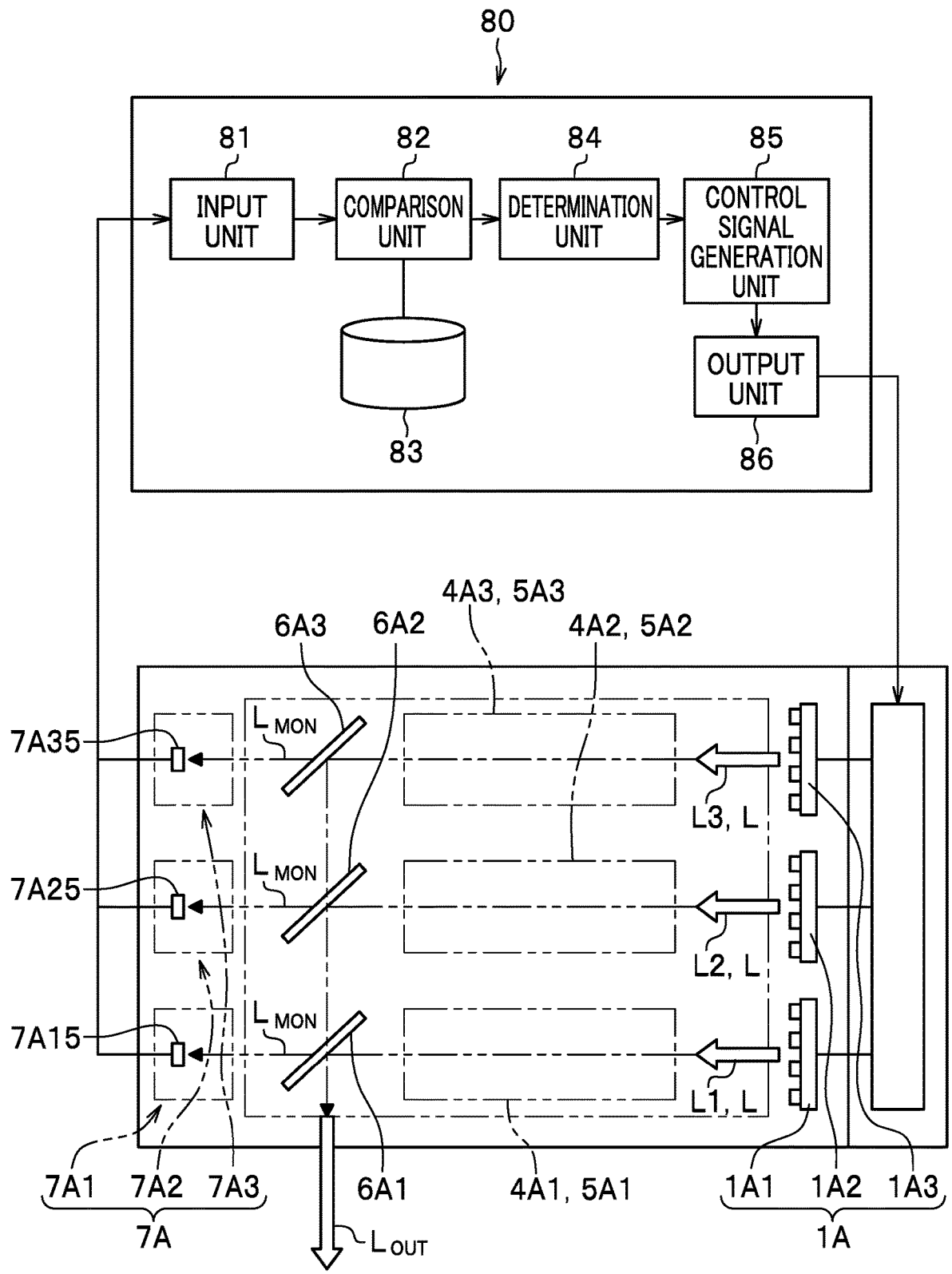
FIG. 5 is a schematic diagram schematically illustrating the detection unit of the light-emitting module and a control mechanism according to the embodiment.
Figure 6:
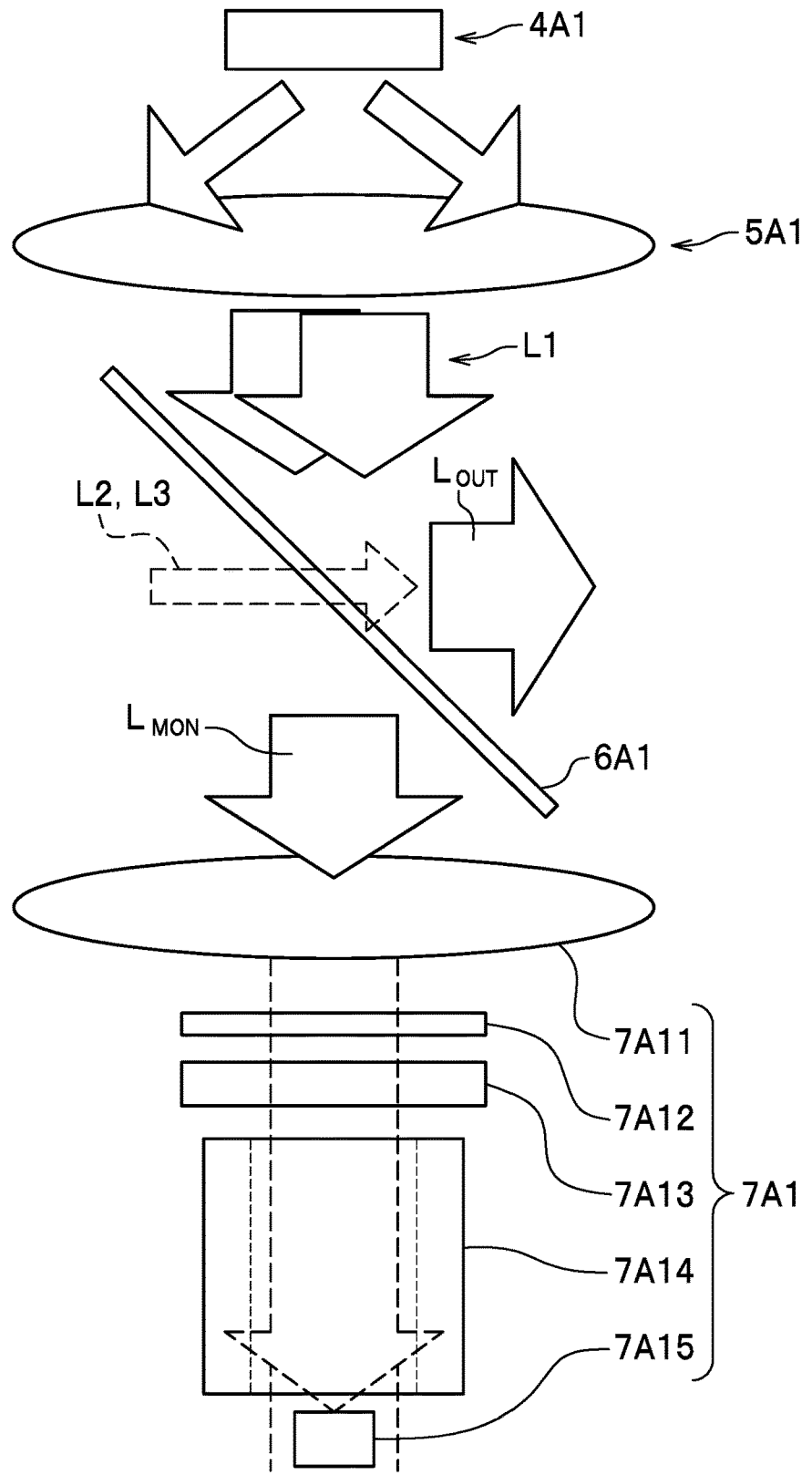
FIG. 6 is an explanatory diagram schematically illustrating a state of light of the detection unit of the light-emitting module according to the embodiment.

A light-emitting module 100A according to a first embodiment will be described. FIGS. 1 to 5 are drawings for explaining an exemplary form of the light-emitting module 100A. FIG. 1 is a plan view schematically illustrating the inside of the light-emitting module according to the embodiment. FIG. 2 is an explanatory diagram schematically illustrating configurations of the light-emitting module according to the embodiment. FIG. 3 is an explanatory diagram schematically illustrating a detection unit of the light-emitting module according to the embodiment. FIG. 4 is an explanatory diagram schematically illustrating a distribution of light of a rod integrator used in the detection unit of the light-emitting module according to the embodiment. FIG. 5 is a schematic diagram schematically illustrating the detection unit of the light-emitting module and a control mechanism according to the embodiment. Note that a reference character L indicating light is used when the light is collectively indicated in an optical system 10A, and L1, L2, and L3 indicate traveling directions of first light from a first optical system 10A1, second light from a second optical system 10A2, and third light from a third optical system 10A3, respectively. Further, light that is obtained from light emitted from a light-emitting element 12A and is output to the outside by an optical member is indicated as output light $L_{OUT}$, and light used for monitoring in order to control the output light is indicated as monitor light $L_{MON}$.

The light-emitting module 100A includes a plurality of the light-emitting elements 12A, one or more optical members 36A, and a detection unit 7A. The one or more optical members 36A include a first optical member 36A1 on which the light emitted from the plurality of light-emitting elements 12A is incident. The plurality of light-emitting elements 12A include a plurality of first light-emitting elements 12A1 formed of all of the light-emitting elements 12A having the light incident on one first optical member 36A1. The one or more optical members 36A control the light L emitted from each of the plurality of light-emitting elements 12A, and emit the output light $L_{OUT}$ and the monitor light $L_{MON}$ for controlling an output of the output light $L_{OUT}$. The detection unit 7A detects the monitor light $L_{MON}$. Further, the detection unit 7A includes a first condensing lens (hereinafter referred to as a first detection condensing lens) 71A and a light-receiving element 75A. The first detection condensing lens 71A includes an incident surface on which the monitor light $L_{MON}$ is incident, and condenses the monitor light $L_{MON}$ incident on the incident surface. The light-receiving element 75A includes a light-receiving surface having an area smaller than an area of the first condensing lens for detection (hereinafter referred to as the first detection condensing lens) 71A and also smaller than an incident region of the incident surface of the first detection condensing lens 71A on which the monitor light $L_{MON}$ is incident, and receives the monitor light $L_{MON}$ from the first detection condensing lens 71A. The monitor light incident on the incident region of the first detection condensing lens 71A includes light obtained from the light emitted from each of the plurality of first light-emitting elements 12A.

In the light-emitting module 100A, the detection unit 7A includes a filter 72A, a diffusion plate 73A, and a rod integrator 74A. The detection unit 7A includes the filter 72A, the diffusion plate 73A, and the rod integrator 74A from the first detection condensing lens 71A side between the first detection condensing lens 71A and the light-receiving element 75A. Each configuration of the light-emitting module 100A is disposed inside a housing 9. Further, the light-emitting module 100A outputs a detection signal from the detection unit 7A to transmit the detection signal to a control unit 80, and the control unit 80 controls a power source of a light source 1A, in response to the detection signal. Then, as an example, the light-emitting module 100A includes, inside the housing 9, the optical system 10A and the detection unit 7A that detects the monitor light from the optical system 10A. The optical system 10A includes a plurality of light-emitting devices 2A each including the light-emitting element 12A, and the one or more optical members 36A.

Components of Light-Emitting Module

The light-emitting module 100A includes a plurality of components including the housing 9 in which a light extraction opening 8 extracting light is formed, one or more the optical systems 10A provided inside the housing 9, and one or more the detection units 7A. Note that, as illustrated in FIG. 1, in the example of the illustrated light-emitting module 100A, the light-emitting module 100A includes the plurality of optical systems 10A including the first optical system 10A1, the second optical system 10A2, and the third optical system 10A3. Further, the light-emitting module 100A includes the plurality of detection units 7A including a first detection unit 7A1, a second detection unit 7A2, and a third detection unit 7A3. The light-emitting module 100A further includes a heat sink 20. In the light-emitting module 100A, each of the optical systems 10A can be independently driven. In this way, the light emitted from each of the optical systems can be independently or mixedly output from the light extraction opening 8 to the outside. Further, heat generated from the light source 1A included in each of the optical systems 10A is dissipated by the heat sink 20.

Housing

The housing 9 includes an upper surface, a lower surface, and one or more lateral surfaces. The housing 9 is formed in a shape provided with an opening in one surface of a rectangular parallelepiped. The housing 9 includes an arrangement region in which the one or more optical systems are disposed. The arrangement region may be formed of one or more flat surfaces. For example, the arrangement region may have a stepped structure, and the components may be disposed on the flat surfaces at upper and lower stages.

The light extraction opening 8 is formed as an opening in one lateral surface of the housing 9. A through hole of the lateral surface is covered by a light-transmissive member. As the light-transmissive member, for example, glass having transmissivity can be used. In the present application, "having transmissivity" means having a transmittance of 90% or greater with respect to visible light or light of a specific wavelength range (color) of visible light.

The housing 9 can be formed by using, for example, a metal such as aluminum as a main material. Further, the housing 9 is formed of a material having light shielding properties. In the present application, "having light shielding properties" means that the transmittance with respect to visible light is 5.0% or less. Note that a material other than the metal may be used as the main material. Further, the housing 9 may have the light shielding properties on the upper surface, the lower surface, and the one or more lateral surfaces by performing surface processing that can shield light on an inner surface of these surfaces. Note that the housing 9 has transmissivity in a region such as the light extraction opening 8 in which the light is extracted.

Heat Sink

The heat sink 20 includes an upper surface, a lower surface, and one or more lateral surfaces. Further, the heat sink 20 includes a mounting surface on which a heat source is mounted. Any of the upper surface, the lower surface, or the lateral surface(s) can be the mounting surface. The heat sink 20 dissipates the heat generated from the heat source to the outside of the light-emitting module 100A. Note that the heat sink 20 may further include one or more the lateral surfaces. In the example of the illustrated light-emitting module 100A, the heat sink 20 has a rectangular parallelepiped outer shape.

Optical System

The optical system 10A can have a wavelength conversion function. Alternatively, the optical system 10A can be formed without having the wavelength conversion function. Further, when the light-emitting module 100A includes a plurality of optical systems 10A, the plurality of optical systems 10A may include an optical system 10A having the wavelength conversion function and an optical system 10A not having the wavelength conversion function. The optical system 10A having the wavelength conversion function and the optical system 10A not having the wavelength conversion function will be described below. Note that, in the example of the illustrated light-emitting module 100A, the first optical system 10A1 is the optical system 10A not having the wavelength conversion function, and the second optical system 10A2 and the third optical system 10A3 are the optical systems 10A having the wavelength conversion function.

Optical System not Having Wavelength Conversion Function

The optical system 10A not having the wavelength conversion function includes the plurality of light-emitting devices 2A. Further, the optical system 10A includes the plurality of optical members 36A including the light source 1A, a condensing lens 3A, a diffusion member 4A1, one or more lenses 5A, and a light reflective member 6A.

Light Source

The light source 1A includes the plurality of light-emitting devices 2A. In the light source 1A, the plurality of light-emitting devices 2A are aligned and disposed on a substrate. The light-emitting device 2A emits parallel light from an emission surface. Note that the light-emitting device 2A includes the light-emitting element 12A such as a semiconductor laser element that emits laser light, and a lens that collimates the light emitted from the light-emitting element 12A. Therefore, it can be said that the light source 1A includes the plurality of light-emitting elements 12A. Note that the light source 1A may be configured by disposing the light-emitting elements 12A instead of the light-emitting devices 2A on the substrate.

The light source 1A is mounted on the mounting surface. The plurality of light-emitting devices 2A are disposed on the mounting surface. It can be said that the plurality of light-emitting elements 12A are disposed on the mounting surface. The plurality of light-emitting elements 12A are disposed side by side in the light source 1A. Among the plurality of light-emitting elements 12A disposed side by side, the light-emitting element 12A disposed at each end is referred to as a first light-emitting element 12A, and the one or more light-emitting elements 12A disposed between a plurality of the first light-emitting elements 12A are referred to as second light-emitting element(s) 12A. In the example of the illustrated light-emitting module 100A, in the light source 1A, 16 light-emitting elements 12A are aligned in four rows and four columns in which the first light-emitting element 12A is disposed in each of four corners, and a total of 12 second light-emitting elements 12A are disposed therebetween.

The light-emitting element 12A is not limited to the semiconductor laser element; rather, a light-emitting element such as an LED or an organic EL may be employed. For example, the light-emitting element 12A can employ a light-emitting element that emits light having an emission peak wavelength of the light-emitting element 12A in a range from 365 nm to 494 nm. Note that light having a peak wavelength outside this range may also be employed.

Further, in the light source 1A, all of the light-emitting elements 12A emit light of the same color. Further, the light source 1A may include the plurality of light-emitting elements 12A that emit light of the same color having emission peak wavelengths different in a range of several nm. The range of several nm used here is, for example, in a range of ±5 nm. Note that the plurality of light-emitting elements 12A having different peak wavelengths may be included. For example, the light-emitting element 12A that emits blue light and the light-emitting element 12A that emits purple light may be included in the light source 1A.

In the present application, "blue light" refers to light having an emission peak wavelength in a range from 430 nm to 494 nm. "Purple light" refers to light having an emission peak wavelength in a range from 365 nm to 429 nm. Examples of the light-emitting element that emits blue light or purple light include a semiconductor laser element including a nitride semiconductor. GaN, InGaN, and AlGaN, for example, can be used as the nitride semiconductor.

Condensing Lens

The condensing lens 3A is one of the optical members 36A on which the light emitted from the plurality of light-emitting elements 12A is incident. The condensing lens 3A is a lens that condenses light. For example, a plano-convex lens in which one surface is formed of a convex lens and an opposite surface is formed of a flat surface can be used as the condensing lens 3A. The condensing lens 3A may be a single lens or a doublet lens as long as the condensing lens 3A is the lens that condenses light.

Diffusion Member

The diffusion member 4A1 is one of the optical members 36A on which the light emitted from the plurality of light-emitting elements 12A is incident. The diffusion member 4A1 includes an incident surface 4A1a and an exit surface 4A1b. Light incident from the incident surface 4A1a is diffused and exits from the exit surface 4A1b. As an example, the diffusion member 4A1 is formed in a rectangular plate shape or a circular plate shape. The diffusion member 4A1 is formed of a transparent material, for example, glass or a resin material, and diffuses and transmits the incident light. In other words, the diffusion member 4A1 diffuses light by, for example, as a structure that diffuses light, providing fine protrusions and recessions on one surface or both surfaces of the diffusion member 4A1, or dispersing a material having a different refractive index in the diffusion member.

For example, a member in which an epoxy resin, a silicone resin, a resin obtained by mixing the epoxy resin and the silicone resin, or a light-transmissive material such as glass is used as a base material, and a white inorganic fine particle such as $SiO_2$ and $TiO_2$ is contained as a diffusion material in the base material can be used as the diffusion member 4A1. Further, a light reflective member such as a white-based-color resin or a metal processed in a fine particle shape can also be used as the diffusion material. The diffusion materials are randomly contained inside the base material, and thus randomly and repeatedly reflect light passing through the inside of a light diffusion member to diffuse the transmitted light in multiple directions. Thus, the diffusion materials suppress local concentration of irradiation light. A shape of the diffusion member 4A1 is preferably the rectangular plate shape or the circular plate shape.

One or More Lenses

Each of the one or more lenses 5A is one of the optical members 36A on which the light emitted from the plurality of light-emitting elements 12A is incident. The one or more lenses 5A collimate the incident light and emit the light as parallel light. For example, the optical system 10A can be formed of the plurality of lenses 5A including a receiver lens 5A11 that receives light first, and a collimating lens 5A12 that collimates the light exiting from the receiver lens 5A11. The two lenses 5A are different in size. Further, the two lenses 5A are supported by a lens holder 45A. Optical axes of the two lenses supported by the lens holder 45A are aligned on a straight line. Note that the lens 5A may be formed of one lens.

The lens holder 45A has shielding properties with respect to light, and absorbs, reflects, or shields the light with which the lens holder 45A is irradiated. A surface of the lens holder 45A can shield the light by optical action such as absorption, reflection, or light shielding. The lens holder 45A is formed of, for example, a resin material or a metal material. Then, it is preferable that a shielding means is formed on the surface of the lens holder 45A such that blasting processing is performed or a light shielding film is provided.

Light Reflective Member

The light reflective member 6A is one of the optical members 36A on which the light emitted from the plurality of light-emitting elements 12A is incident. The light reflective member 6A reflects the light in a predetermined wavelength range. A reflectance used here is 80% or greater. Further, the light reflective member 6A transmits the light in a wavelength range different from the predetermined wavelength range. A transmittance used here is 80% or greater. Further, the light reflective member 6A includes a first surface on which the light is incident. Further, a second surface is provided on a side opposite to the first surface.

As an example, a dichroic mirror is used as the light reflective member 6A.

The light in a specific wavelength range is emitted from the optical system 10A. For example, the light in the specific wavelength range is light in a range included in a wavelength range of the light emitted from the light-emitting element 12A. Further, the light in the specific wavelength range is light in a range included in a wavelength range of light emitted after being diffused by the diffusion member 4A1 based on the light from the light-emitting element 12A. Furthermore, the light in the specific wavelength range is light having the peak wavelength emitted from the light-emitting element 12A, or light included in light having the peak wavelength emitted after being diffused.

Optical System Having Wavelength Conversion Function

The optical system 10A having the wavelength conversion function includes the light source 1A including the one or more light-emitting devices 2A. Further, the optical system 10A includes the plurality of optical members 36A including the condensing lens 3A, a wavelength conversion member 4A, the one or more lenses 5A, and the light reflective member 6A. Further, the wavelength conversion member 4A can be provided as a part of a configuration of a phosphor wheel. Note that the optical system 10A having the wavelength conversion function is specifically the second optical system 10A2 and the third optical system 10A3, and duplicate descriptions of duplicate components are as described above.

Phosphor Wheel

A phosphor wheel 40A includes a circular plate 40A1 in which one or more wavelength conversion members are formed in an annular band, a support 40A2 that rotatably supports the circular plate 40A1, and a rotation drive unit 40A3 that rotates the circular plate 40A1. When the circular plate 40A1 includes the plurality of wavelength conversion members, the plurality of wavelength conversion members each have the annular band having a different radius, and are separated from each other.

A light-transmissive member formed in a circular plate shape is used as the circular plate 40A1. Sapphire can be used as a material of the circular plate 40A1. Further, a resin material such as a thermoplastic resin such as acrylic, polycarbonate, cyclic polyolefin, polyethylene terephthalate, or polyester, or a thermosetting resin such as an epoxy resin or a silicone resin, or a material having the transmissivity such as glass can be used.

Wavelength Conversion Member

The wavelength conversion member 4A is one of the optical members 36A on which the light emitted from the plurality of light-emitting elements 12A is incident. The wavelength conversion member 4A is provided in an annular band on the inside closer to a center side than an outer edge of the circular plate 40A1, and a phosphor, a quantum dot, and the like that convert a wavelength are applied. As the phosphor, for example, a garnet-based phosphor such as a YAG phosphor or an LAG phosphor can be employed. Further, other phosphors can also be used. The phosphor may be used by combining a plurality of types of phosphors. For example, by using phosphors of different luminescent colors in a combination or at a combination ratio suitable for a desired color tone, color rendering properties and color reproduction properties can be adjusted.

A drive motor that rotates the circular plate 40A1 can be used as the rotation drive unit 40A3. The rotation drive unit 40A3 is, for example, a DC motor, a brush motor, a brushless motor, a stepping motor, or the like, and can preferably rotate the circular plate 40A1 in one side direction and another side direction.

One or More Lenses and Light Reflective Member

Each of the one or more lenses 5A is one of the optical members 36A on which fluorescence converted by the wavelength conversion member 4A from the light emitted from the plurality of light-emitting elements 12A is incident. The one or more lenses 5A collimate the incident light and allows the light to exit as the parallel light. Here, the light emitted from the light-emitting element 12A or the light converted by the wavelength conversion member 4A from the light emitted from the light-emitting element 12A can be referred to as light obtained from the light emitted from the light-emitting element 12A. In other words, the light obtained from the light emitted from the light-emitting element 12A may be the light itself emitted from the light-emitting element 12A, or may be other light obtained by using the light emitted from the light-emitting element 12A.

Note that the light incident on the one or more lenses 5A may include not only the light having the wavelength converted by the wavelength conversion member 4A, but also a part of the light emitted from the light-emitting element 12A. For example, the entire light emitted from the light-emitting element 12A do not have to be converted by the wavelength conversion member 4A, and a part of the light may be emitted from the wavelength conversion member 4A.

The light reflective member 6A is one of the optical members 36A on which the light obtained from the light emitted from the plurality of light-emitting elements 12A is incident.

Detection Unit

The detection unit 7A detects the monitor light $L_{MON}$ and controls the light source 1A. The detection unit 7A includes the first detection condensing lens 71A, and the light-receiving element 75A that detects the light condensed by the first detection condensing lens 71A. Note that, here, as an example, the detection unit 7A includes the filter 72A, the diffusion plate 73A, and the rod integrator 74A (7A14, 7A24, and 7A34) in an order from the first detection condensing lens 71A side between the first detection condensing lens 71A and the light-receiving element 75A.

The first detection condensing lens 71A and the light-receiving element 75A are arranged such that an optical axis of the first detection condensing lens 71A passes through the incident region of the monitor light $L_{MON}$ with which the incident surface is irradiated. Here, the optical axis of the first detection condensing lens 71A is arranged so as to pass through substantially the center of the diffusion plate 73A, pass through substantially the center of the rod integrator 74A, and pass through the center of the light-receiving element 75A.

The filter 72A allows passage of light with a desired wavelength of the monitor light $L_{MON}$ received by the light-receiving element 75A, and shields light with the other wavelength. For example, of the monitor light $L_{MON}$, the filter 72A shields one of the light emitted from the light-emitting element 12A or the light having the wavelength converted by the wavelength conversion member 4A, and allows passage of the other light. As an example, an optical filter such as a bandpass filter, a notch filter, an edge filter, and a dichroic filter can be used as the filter 72A. In the first optical system 10A1 to the third optical system 10A3 described below, a configuration in which a wavelength of transmitted light or shielded light varies according to a wavelength of the monitor light $L_{MON}$ is used for the filter 72A.

The diffusion plate 73A diffuses the monitor light $L_{MON}$ incident from the first detection condensing lens 71A. For example, the diffusion plate 73A diffuses light concentrated in a specific direction to make the light uniform. The diffusion plate 73A can be formed by containing a diffusion material in a base material. Further, the diffusion plate 73A can be formed by providing protrusions and recessions on a front surface and a back surface. The diffusion plate 73A diffuses the monitor light $L_{MON}$ to make a state in which the light of the light-emitting element 12A of the light source is easy to be observed by the light-receiving element 75A. Note that unnecessary light is eliminated by the filter 72A, and only desired light is diffused and transmitted by the diffusion plate 73A. In other words, the diffusion plate 73A can diffuse and transmit the desired light to the rod integrator 74A. In order for more light to be incident on the rod integrator 74A, the diffusion plate 73A is preferably disposed near the rod integrator 74A.

Furthermore, the rod integrator 74A adjusts an intensity distribution of light exiting from the rod integrator 74A such that the light based on each of the light-emitting elements 12A is received near the center of the rod integrator 74A. A member in which a shape inside a pipe is a polygonal cross-sectional shape having four or more corners or a circular cross-sectional shape can be used as the rod integrator 74A. In particular, the rod integrator 74A preferably has a shape inside the pipe in which corners of a polygon are chamfered to be curved or arcuate without having a sharp corner. A member in which four corners of a polygon, for example, a rectangle, are chamfered is preferably used as the rod integrator 74A. In this way, a peak PK of transmitted light can be at the four corners, whereas the light based on each of the light-emitting elements 12A is more uniformly distributed near the center. By condensing the light based on each of the light-emitting elements 12A near the center of the light emitted from the rod integrator 74A, a light-receiving result in which a state of the light of the light-emitting element 12A of the light source 1A is reflected can be obtained from the monitor light $L_{MON}$ received by the light-receiving element 75A when a positional shift caused by mounting accuracy of the light-receiving element 75A occurs.

The light-receiving element 75A includes the light-receiving surface smaller than an irradiation region of the monitor light $L_{MON}$ transmitted from the rod integrator 74A. The light-receiving element 75A is, for example, a photodiode (PD) as a photodetector. As an example, the light-receiving element 75A is disposed in a position facing the irradiation region at the center of the rod integrator 74A. The light-receiving element 75A transmits the detection signal to the control unit 80 when the light-receiving element 75A receives the monitor light $L_{MON}$ equal to or greater than a predetermined threshold. Note that, here, the monitor light $L_{MON}$ received by the light-receiving element 75A is diffused by the diffusion plate 73A and is further adjusted by the rod integrator 74A to reflect the entire light emission state of the plurality of light-emitting elements 12A on the light source 1A side. Thus, for example, when any of the light-emitting elements 12A does not emit light, the influence is reflected in the monitor light $L_{MON}$, and the entire state of the light-emitting elements 12A is recognized by detecting a part of the monitor light $L_{MON}$.

In other words, in the detection unit 7A, when any of the plurality of light-emitting elements 12A is in failure, the light-receiving surface is widely irradiated with the light based on the light-emitting element 12A, and thus a state of the individual light-emitting element 12A is easily detected in order to be able to detect the failure. The detection signal is output to the control unit 80 by the monitor light $L_{MON}$ received and detected by the detection unit 7A.

The control unit 80 generates a control signal in response to the detection signal transmitted from the detection unit 7A (or the detection signal not being transmitted), and controls the light source 1A. The control unit 80 includes an input unit 81 that inputs the detection signal from the light-receiving element 75A, a comparison unit 82 that compares the detection signal input by the input unit 81 with a preset condition, a determination unit 84 that determines whether the detection signal compared by the comparison unit 82 is normal, a control signal generation unit 85 that generates the control signal for controlling the power source of the light source 1A by a result determined by the determination unit 84, and an output unit 86 that transmits the control signal generated by the control signal generation unit 85 to the power source.

The input unit 81 is an interface that inputs the detection signal from the light-receiving element 75A and transmits the detection signal to the determination unit 84. Here, as an example, the input unit 81 is configured to recognize, by a timer, that the detection signal is not transmitted. Then, the timer is reset when the detection signal is transmitted. The light-receiving element 75A outputs the detection signal when the light-receiving element 75A receives the monitor light $L_{MON}$ equal to or greater than the predetermined threshold. Thus, the detection signal is not output when the light-receiving element 75A receives the monitor light $L_{MON}$ less than the threshold. Therefore, in a case in which a predetermined time has elapsed since the timer is activated when the detection signal cannot be input, the input unit 81 outputs, to the comparison unit 82, for example, a value of zero indicating that the light-receiving element 75A does not receive the monitor light $L_{MON}$ equal to or greater than the threshold.

The comparison unit 82 compares the value of the detection signal transmitted from the input unit 81 with the preset condition, and transmits a compared result to the determination unit 84. For example, the comparison unit 82 compares, with a transmission signal transmitted from the input unit 81, an allowable range of a value of the monitor light $L_{MON}$ stored in a storage unit 83 such as a memory and corresponding to a value of the output light $L_{OUT}$, and outputs a compared result to the determination unit 84. More specifically, an allowable range with respect to a value of the monitor light $L_{MON}$ received by the light-receiving element 75A when the output light $L_{OUT}$ desired by a user is emitted in a normal state is stored in the storage unit 83 in advance. The allowable range is a fluctuation range of the value of the monitor light $L_{MON}$ when all of the light-emitting elements 12A operate in a range considered normal. The light emitted from the light-emitting element 12A fluctuates with a change in an ambient temperature according to temperature characteristics. Thus, when the light falls within such a fluctuation range, it can be said that the light-emitting element 12A is not in failure and is in a normal operation range. On the other hand, when the value exceeds the fluctuation range, a high possibility that some sort of failure occurs in the light-emitting element 12A can be determined. When a value of the transmitted detection signal falls in the allowable range, the comparison unit 82 transmits, to the determination unit 84, a signal that has a positive value indicating the normal state and indicates a difference from an ideal value (value of the monitor light $L_{MON}$ corresponding to the value of the output light $L_{OUT}$). Further, when a value of the detection signal does not fall in the allowable range, the comparison unit 82 transmits, to the determination unit 84, a signal that has a negative value indicating an abnormal state.

The determination unit 84 determines whether the amount of light of the monitor light $L_{MON}$ received by the light-receiving element 75A is appropriate, in response to the signal transmitted from the comparison unit 82. When the signal transmitted from the comparison unit 82 has the negative value, the determination unit 84 instructs the control signal generation unit 85 to generate an error signal indicating the abnormal state. Further, when the signal transmitted from the comparison unit 82 has the positive value, the determination unit 84 instructs the control signal generation unit 85 to generate a signal that reduces, increases, or maintains the amount of light of the light source 1A such that the value of the monitor light $L_{MON}$ approaches the ideal value, in response to the difference from the ideal value.

The control signal generation unit 85 generates the control signal, in response to the instruction received from the determination unit 84, and transmits the control signal to the output unit 86. As an example, when the light from the light source 1A is weak, the control signal generation unit 85 is instructed to generate the signal that increases the amount of light of the light source 1A as a determination result of the determination unit 84, and thus the control signal generation unit 85 generates the control signal for controlling an output of the light from the light source 1A to be increased. Further, as an example, when the light from the light source 1A is strong, the control signal generation unit 85 is instructed to generate the signal that reduces the amount of light of the light source 1A as a determination result of the determination unit 84, and thus, the control signal generation unit 85 generates the control signal for controlling an output of the light from the light source 1A to be reduced. Note that, when the signal transmitted from the determination unit 84 has a value of zero as an example, the control signal generation unit 85 does not particularly generate the control signal, or generates the control signal for maintaining the state of the light source 1A. Further, when the abnormal state occurs, the control signal generation unit 85 generates the error signal, and makes notification that an error occurs in a display such as a monitor.

Light-Emitting Module 100A

Next, the light-emitting module 100A will be described.

The one or more optical systems 10A are mounted in the light-emitting module 100A. The one or more optical systems 10A include the optical system 10A not having the wavelength conversion function. The one or more optical systems 10A further include the optical system 10A having the wavelength conversion function.

In the example of the illustrated light-emitting module 100A, the light-emitting module 100A includes the first optical system 10A1 not having the wavelength conversion function, and the second optical system 10A2 and the third optical system 10A3 having the wavelength conversion function. The first optical system 10A1 includes the plurality of first light-emitting elements 12A1 and one or more the first optical members 36A1. The first optical system 10A1 includes a first light source 1A1 including the plurality of first light-emitting elements 12A1. Further, the one or more first optical members 36A1 include a first condensing lens 3A1, the diffusion member 4A1, a first lens 5A1, and a first light reflective member 6A1. The second optical system 10A2 includes a plurality of second light-emitting elements 12A2 and one or more second optical members 36A2. The second optical system 10A2 includes a second light source 1A2 including the plurality of second light-emitting elements 12A2. Further, the one or more second optical members 36A2 include a second condensing lens 3A2, a second wavelength conversion member 4A2, a second lens 5A2, and a second light reflective member 6A2. Further, the third optical system 10A3 includes a plurality of third light-emitting elements 12A3 and one or more third optical members 36A3. The third optical system 10A3 includes a third light source 1A3 including the plurality of third light-emitting elements 12A3. Further, the one or more third optical members 36A3 include a third condensing lens 3A3, a third wavelength conversion member 4A3, a third lens 5A3, and a third light reflective member 6A3.

The one or more optical systems 10A emit light having peak wavelengths different from each other toward the light extraction opening 8. In the example of the illustrated light-emitting module 100A, the peak wavelength of the light (first light) emitted from the first optical system 10A1, the peak wavelength of the light (second light) emitted from the second optical system 10A2, and the peak wavelength of the light (third light) emitted from the third optical system 10A3 are different from one another.

The one or more optical systems 10A are mounted inside the housing 9. The plurality of optical systems 10A are disposed in a state in parallel with each other inside the housing 9. The plurality of optical systems 10A are disposed such that light is combined when the light from the plurality of optical systems 10A is output from the light extraction opening 8 of the housing 9. When the plurality of optical systems 10A are mounted, it is preferable that the optical systems 10A are appropriately partitioned such that light emitted from one optical system 10A does not influence the other optical system 10A inside the housing 9.

The light source 1A included in each of the one or more optical systems 10A are fixed to the heat sink 20. In this way, the heat generated from each light source 1A can be dissipated to the outside. The heat sink 20 is disposed on an opposite side from the light extraction opening 8 with the light source 1A interposed between the heat sink 20 and the light extraction opening 8. The heat sink 20 is preferably disposed outside the housing 9 so as not to keep the heat inside the housing 9.

The first optical system 10A1 in the light-emitting module 100A will be described. The first light source 1A1 emits the first light L1. The first light L1 travels forward from the first light source 1A1. The first light is formed of one or more beams of light at a point where the first light is emitted from one or more first light-emitting devices 2A1. In the drawings, an imaginary optical path of a center G11 of the first light is illustrated for convenience.

The first light emitted from the first light source 1A1 is condensed by the first condensing lens 3A1. The light emitted from all of the light-emitting elements 12A1 constituting the first light source 1A1 is incident on the first condensing lens 3A1. The light exiting from an exit surface of the first condensing lens 3A1 travels in a straight line to the diffusion member 4A1. The first condensing lens 3A1 condenses the first light and allows the first light to exit toward the incident surface 4A1a of the diffusion member 4A1. It can be said that the exit surface of the first condensing lens 3A1 is an exit surface from which the first light (condensed light) traveling in the straight line to the diffusion member 4A1 exits.

The first condensing lens 3A1 is disposed such that an optical axis of the first condensing lens 3A1 is located on an imaginary straight line that passes through the center G11 of an emission position of the first light and is perpendicular to an emission surface of the first light-emitting device 2A1 when viewed in a plan view parallel to the emission surface of the first light-emitting device 2A1. Here, the imaginary straight line and a straight line that passes through the optical axis of the first condensing lens 3A1 have an overlapping positional relationship.

The incident surface of the diffusion member 4A1 is irradiated with the first light (condensed light) condensed by the first condensing lens 3A1. A center G12 of an irradiation region RE1 of the first light (condensed light) with which the incident surface 4A1a of the diffusion member 4A1 is irradiated is located on the imaginary straight line described above.

The first light (condensed light) with which the incident surface 4A1a of the diffusion member 4A1 is irradiated is diffused and exits from the exit surface 4A1b of the diffusion member 4A1. The first light (diffused light) exiting from the exit surface 4A1b of the diffusion member 4A1 is incident on the first lens 5A1 (the receiver lens 5A11 and the collimating lens 5A12). The first light incident on the first lens 5A1 is allowed to exit toward the light extraction opening 8 of the housing 9 by the first light reflective member 6A1.

The first lens 5A1 collimates the first light (diffused light) exiting from the exit surface 4A1b of the diffusion member 4A1. The collimated first light exits from an exit surface of the first lens 5A1. The first lens 5A1 is designed to collimate the diffused light exiting from a focal point of the first lens 5A1 to the first lens 5A1. Further, light that passes through an optical axis of the first lens 5A1 is at the center of the first light being the collimated light or substantially the center of the light.

The collimated light exiting from the first lens 5A1 is incident on the first light reflective member 6A1. The first light reflective member 6A1 reflects the first light incident on the first light reflective member 6A1. The first light reflected by the first light reflective member 6A1 travels toward the light extraction opening 8, and exits from the light extraction opening 8 to the outside. 80% or greater of the first light incident on the first light reflective member 6A1 is reflected by the first light reflective member 6A1. 20% or less of the first light incident on the first light reflective member 6A1 is transmitted through the first light reflective member 6A1.

In this way, the light reflected by the first light reflective member 6A1 includes the light obtained from the light emitted from each of all the light-emitting elements 12A1 constituting the first light source 1A1. Further, the light transmitted through the first light reflective member 6A1 includes the light obtained from the light emitted from each of all the light-emitting elements 12A1 constituting the first light source 1A1.

Further, the monitor light $L_{MON}$ being the light transmitted through the first light reflective member 6A1 is incident on a first detection condensing lens 7A11 of the first detection unit 7A1. In this way, a part of the first light L1 emitted from the first optical system 10A1 serves as the output light $L_{OUT}$ from the light extraction opening 8 of the housing 9 to the outside, and the remaining first light L1 serves as the monitor light $L_{MON}$. In other words, mixed light of the output light $L_{OUT}$ and the monitor light $L_{MON}$ becomes the parallel light by the collimating lens 5A12, and the output light $L_{OUT}$ of the parallel light and the monitor light $L_{MON}$ of the parallel light are divided by the first light reflective member 6A1.

The monitor light $L_{MON}$ includes the light obtained from the light emitted from each of all the light-emitting elements 12A1 constituting the first light source 1A1. Further, the light obtained from the light emitted from each of all the light-emitting elements 12A1 constituting the first light source 1A1 is incident on the first detection condensing lens 7A11. Then, the monitor light $L_{MON}$ condensed by the first detection condensing lens 7A11 is diffused by a diffusion plate 7A13, and the diffused monitor light $L_{MON}$ is transmitted to the rod integrator 7A14. The monitor light $L_{MON}$ incident on the rod integrator 7A14 is made uniform. The rod integrator 7A14 irradiates a light-receiving element 7A15 with the uniform monitor light $L_{MON}$. The light-receiving element 7A15 detects the light when the amount of the light incident on a light-receiving surface is equal to or greater than a threshold, and outputs a detection signal in response to the detection to the control unit 80.

The light-receiving element 7A15 is disposed to face the center of the rod integrator 7A14, and thus the light-receiving element 7A15 can receive the uniform monitor light $L_{MON}$ from the rod integrator 7A14. The light-receiving element 7A15 includes a light-receiving surface having an area smaller than an area of a region (hereinafter referred to as an incident region) of an incident surface of the first detection condensing lens 7A11 on which the monitor light $L_{MON}$ is incident. Further, the light-receiving element 7A15 is disposed such that an optical axis of the first detection condensing lens 7A11 passes through the light-receiving surface of the light-receiving element 7A15. Note that, in the plan view in which the incident surface of the first detection condensing lens 7A11 is viewed from an optical axis direction, of the monitor light $L_{MON}$ incident on the incident surface, the amount of the light incident on a region that has the same shape and the same area as those of the light-receiving surface of the light-receiving element 7A15 and includes the optical axis of the first detection condensing lens 7A11 may be equal to or greater than the threshold described above. In other words, when the light equal to or greater than the threshold is simply desired to be received by the light-receiving element 7A15, the light equal to or greater than the threshold may be received by the light-receiving surface of the light-receiving element 7A15 without the first detection condensing lens 7A11. In this way, the first detection condensing lens 7A11 is provided for a purpose of detecting the light emitted from each of all the light-emitting elements 12A1 constituting the first light source 1A1.

Thus, in any light-emitting element 12A of all the light-emitting elements 12A1 constituting the first light source 1A1, when the amount of the light emitted from the light-emitting element 12A is increased or decreased, the amount of the monitor light $L_{MON}$ exiting from the one or more optical members 36A and received by the light-receiving surface of the light-receiving element 75A also fluctuates according to the increase or the decrease. Further, the entire light of the plurality of light-emitting elements 12A is in a dispersed uniform state until the entire light passes through the rod integrator 7A14. Thus, when the amount of the light of any one of the light-emitting elements 12A is increased or decreased for some reason, the state change is reflected in the amount of the received light in the light-receiving element 75A.

Next, the second optical system 10A2 in the light-emitting module 100A will be described. The second light source 1A2 emits the second light L2. The second light L2 travels forward from the second light source 1A2. The second light L2 travels in the same direction as the direction of the first light L1. The second light is formed of one or more beams of light at a point where the second light is emitted from one or more second light-emitting devices 2A2. In the drawings, an imaginary optical path of a center G21 of the second light is illustrated for convenience.

The second light emitted from the second light source 1A2 is condensed by the second condensing lens 3A2. The light emitted from all of the light-emitting elements 12A2 constituting the second light source 1A2 is incident on the second condensing lens 3A2. The light exiting from an exit surface of the second condensing lens 3A2 travels in a straight line to the second wavelength conversion member 4A2. The second condensing lens 3A2 condenses the second light and allows the second light to exit toward an incident surface of the second wavelength conversion member 4A2.

The second wavelength conversion member 4A2 emits the irradiated second light from an emission surface of the second wavelength conversion member 4A2 as wavelength-converted light. The wavelength of a part or all of the second light with which the second wavelength conversion member 4A2 is irradiated is converted by the second wavelength conversion member 4A2. Thus, the second light emitted from the emission surface of the second wavelength conversion member 4A2 may include not only the wavelength-converted light, but also the light emitted from the second light-emitting device 2A2.

The second light emitted from the emission surface of the second wavelength conversion member 4A2 is incident on the second lens 5A2. The second light incident on the second lens 5A2 is allowed to exit toward the light extraction opening 8 of the housing 9 by the second light reflective member 6A2. The second light toward the light extraction opening 8 of the housing 9 is transmitted through the first light reflective member 6A1 and exits as the output light $L_{OUT}$ from the light extraction opening 8 of the housing 9.

The second optical member 36A2 is disposed in a position passed by an imaginary straight line that connects the center G21 of an emission position of the light in a plane parallel to the emission surface of the second light-emitting device 2A2 and a center G22 of an irradiation region RE2 of the light in the second wavelength conversion member 4A2.

The second light emitted toward the light extraction opening 8 is the light having the wavelength converted by the second wavelength conversion member 4A2. The second light emitted toward the light extraction opening 8 does not include the light emitted from the second light-emitting device 2A2. Note that the phrases "not include" and "not including" used here allow for a small amount of light to be emitted toward the light extraction opening 8 due to performance of the second optical member 36A2.

The second optical system 10A2 can include the plurality of second optical members 36A2, each including the second lens 5A2 held by a second lens holder 45A2, and the second light reflective member 6A2. The second light emitted from the emission surface of the second wavelength conversion member 4A2 is incident on the second lens 5A2. The second light exiting from an exit surface of the second lens 5A2 is incident on the second light reflective member 6A2.

The second lens 5A2 collimates the second light emitted from the emission surface of the second wavelength conversion member 4A2. The collimated second light exits from the exit surface of the second lens 5A2. The second lens 5A2 is designed so as to collimate diffused light emitted from a focal point of the second lens 5A2 to the second lens 5A2. Further, light that passes through an optical axis of the second lens 5A2 is at the center of the second light being the collimated light or substantially the center of the light.

The collimated light exiting from the second lens 5A2 is incident on the second light reflective member 6A2. The second light reflective member 6A2 reflects the second light incident on the second light reflective member 6A2. The second light reflected by the second light reflective member 6A2 travels as the output light $L_{OUT}$ toward the light extraction opening 8, and exits from the light extraction opening 8 to the outside. The light emitted from the second light-emitting device 2A2 of the second light incident on the second light reflective member 6A2 is transmitted through the second light reflective member 6A2 and used as the monitor light $L_{MON}$. A part of the light having the wavelength converted by the second wavelength conversion member 4A2 of the second light incident on the second light reflective member 6A2 is transmitted through the second light reflective member 6A2 and used as the monitor light $L_{MON}$. Note that the light emitted from the second light-emitting device 2A2 may not be used as the monitor light $L_{MON}$. Then, the monitor light $L_{MON}$ is detected by the second detection unit 7A2, the detection signal by the second detection unit 7A2 is transmitted to the control unit 80, and the power source of the second light source 1A2 is controlled. At this time, the light transmitted through the second light reflective member 6A2 includes the light obtained from the light emitted from each of all the light-emitting elements 12A2 constituting the second light source 1A2.

The description of the third optical system 10A3 in the light-emitting module 100A is similar to that of the second optical system 10A2 described above. In other words, the third optical system 10A3 can be described by replacing the "second light source 1A2" with the "third light source 1A3," the "second light L2" with the "third light L3," the "second light-emitting device 2A2" with a "third light-emitting device 2A3," the "center G21 of the second light L2" with a "center G31 of the third light L3," the "second condensing lens 3A2" with the "third condensing lens 3A3," the "second wavelength conversion member 4A2" with the "third wavelength conversion member 4A3," the "second lens holder 45A2" with a "third lens holder 45A3," the "second optical member 36A2" with the "third optical member 36A3," the "second lens 5A2" with the "third lens 5A3," the "second light reflective member 6A2" with the "third light reflective member 6A3," and the "second detection unit 7A2" with the "third detection unit 7A3" in the description of the second optical system 10A2 described above.

In the light-emitting module 100A, coaxial light in which the first light L1, the second light L2, and the third light L3 are coaxially aligned can be emitted as the output light $L_{OUT}$ from the light extraction opening 8. The second light reflective member 6A2 transmits the third light L3, and the first light reflective member 6A1 transmits the second light L2 and the third light L3.

In the light-emitting module 100A, the second wavelength conversion member 4A2 and the third wavelength conversion member 4A3 are mounted as components of the phosphor wheel 40A. The second wavelength conversion member 4A2 emits orange second light L2 having the wavelength converted. The third wavelength conversion member 4A3 emits green third light L3 having the wavelength converted.

The one or more detection units 7A are mounted in the light-emitting module 100A. The detection unit 7A is disposed in association with each of the optical systems 10A. The same number of the detection units 7A as the number of the optical systems 10A included in the light-emitting module 100A is provided. The detection unit 7A corresponding to each of the optical systems 10A can be disposed inside the housing 9, attached to the housing 9, or disposed outside the housing 9.

Here, as an example, the first detection unit 7A1 to the third detection unit 7A3 are included as the detection unit 7A. Then, the first detection unit 7A1 detects the monitor light $L_{MON}$ of the first light L1 transmitted through the first light reflective member 6A1. The second detection unit 7A2 detects the monitor light $L_{MON}$ of the second light L2 transmitted through the second light reflective member 6A2. The third detection unit 7A3 detects the monitor light $L_{MON}$ of the third light L3 transmitted through the third light reflective member 6A3. From the detection result, the amount of the output light $L_{OUT}$ emitted from the light extraction opening 8 by each of the optical systems 10A can be calculated, and the amount of the output light $L_{OUT}$ emitted from the light extraction opening 8 can be adjusted.

As illustrated in FIG. 5, the first light L1 transmitted through the first light reflective member 6A1, and the second light L2 and the third light L3 reflected by the first light reflective member 6A1 are directed as the monitor light $L_{MON}$ toward the first detection unit.

The second light L2 transmitted through the second light reflective member 6A2 and the third light L3 reflected by the second light reflective member 6A2 are directed as the monitor light $L_{MON}$ toward the second detection unit 7A2.

The third light L3 transmitted through the third light reflective member 6A3 is directed as the monitor light $L_{MON}$ toward the third detection unit 7A3.

The monitor light $L_{MON}$ is transmitted to the diffusion plates 7A13, 7A23 and 7A33 via filters 7A12, 7A22, and 7A32 by the first detection condensing lenses 7A11, 7A21, and 7A31. Note that the diffusion plates 7A13, 7A23, and 7A33 may be included in a state of facing the filters 7A12, 7A22, and 7A32 at an interval, or facing and being in contact with the filters 7A12, 7A22, and 7A32, respectively.

Then, in the first detection unit 7A1, the filter 7A12 transmits the monitor light $L_{MON}$ of the first light L1 and cuts the monitor light $L_{MON}$ of the second light L2 and the monitor light $L_{MON}$ of the third light L3. Note that the filter 7A12 transmits the light emitted from the light-emitting element 12A and diffused by the diffusion member 4A1, and shields the second light and the third light having the wavelength converted.

In the second detection unit 7A2, the filter 7A22 transmits the monitor light $L_{MON}$ of the second light L2 and cuts the monitor light $L_{MON}$ of the third light L3. Note that the filter 7A22 transmits the second light having the wavelength converted, and shields the light emitted from the light-emitting element 12A.

In the third detection unit 7A3, the filter 7A32 transmits the monitor light $L_{MON}$ of the third light L3. Note that the filter 7A32 transmits the monitor light $L_{MON}$ converted its wavelength and transmitted by the third wavelength conversion member 4A3, and cuts light having a wavelength other than the wavelength of the monitor light $L_{MON}$. In other words, the filter 7A32 allows passage of the third light having the wavelength converted, and shields the light emitted from the light-emitting element 12A.

For the monitor light $L_{MON}$ transmitted to the first detection unit 7A1, the first detection unit 7A1 includes the filter 7A12, and thus only the monitor light $L_{MON}$ of the first light L1 can be received and detected by the first light-receiving element 7A15. Furthermore, the detection result received by the light-receiving element 7A15 is transmitted to the control unit 80 to control the power source of the first light source 1A1.

For the monitor light $L_{MON}$ transmitted to the second detection unit 7A2, with the filter 7A22 of the second detection unit 7A2, only the monitor light $L_{MON}$ of the second light L2 can be received and detected by the second light-receiving element 7A25. The detection result received by the second light-receiving element 7A25 is transmitted to the control unit 80 to control the power source of the second light source 1A2.

For the monitor light $L_{MON}$ transmitted to the third detection unit 7A3, with the filter 7A32 of the third detection unit 7A3, only the monitor light $L_{MON}$ of the third light L3 can be received and detected by the third light-receiving element 7A35. The detection result received by the third light-receiving element 7A35 is transmitted to the control unit 80 to control the power source of the third light source 1A3.

As described above, the detection unit 7A of the light-emitting module 100A can accurately receive light, in response to the monitor light $L_{MON}$, and thus an emission state and the like of the light-emitting element 12A of the light source 1A can be controlled. Furthermore, emission of light to the outside in an undesired state can be suppressed. For example, in the light-emitting module 100A, when damage of the diffusion member 4A1 occurs, by accurately receiving and detecting the monitor light $L_{MON}$ in the first light L1 in a high density state emitted from the first light source 1A1, control can also be performed so as not to emit light to the outside by turning off the first light source 1A1 and the like. In this way, the light-emitting module that has good safety for the light output from the light source 1A and also operates in a stable state is realized.

Modified Example

Figure 7A:
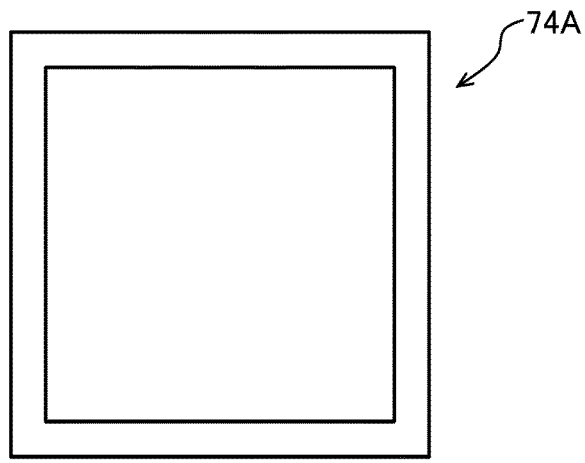
FIG. 7A is a cross-sectional view schematically illustrating another configuration of the rod integrator used in the light-emitting module according to the embodiment.
Figure 7B:
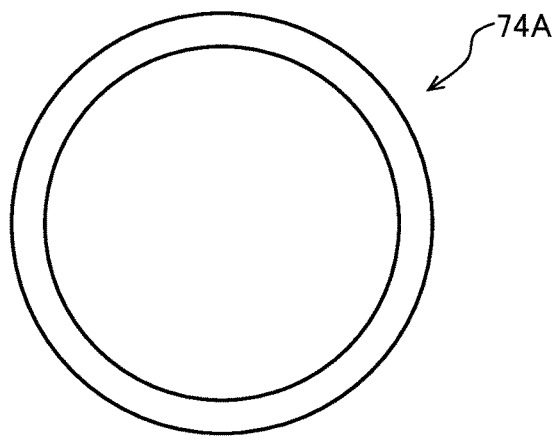
FIG. 7B is a cross-sectional view schematically illustrating another configuration of the rod integrator used in the light-emitting module according to the embodiment.
Figure 7C:
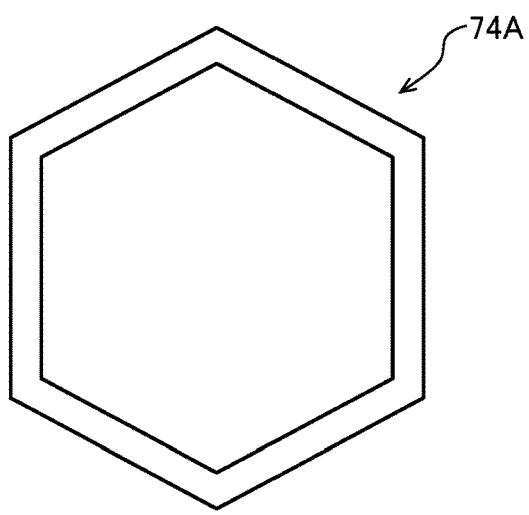
FIG. 7C is a cross-sectional view schematically illustrating another configuration of the rod integrator used in the light-emitting module according to the embodiment.

As illustrated in FIG. 4, in the detection unit 7A, the rod integrator 74A having the rectangular shape inside the pipe with the rounded corners is described as an example, but as illustrated in FIGS. 7A to 7C, a rod integrator having a rectangular, circular, or hexagonal cross-section may be used. Note that the rod integrator 74A may be a polygon more than a tetragon, such as a pentagon and an octagon, as the polygon, and is more preferably in a state with chamfered corners of the polygon.

Figure 8A:
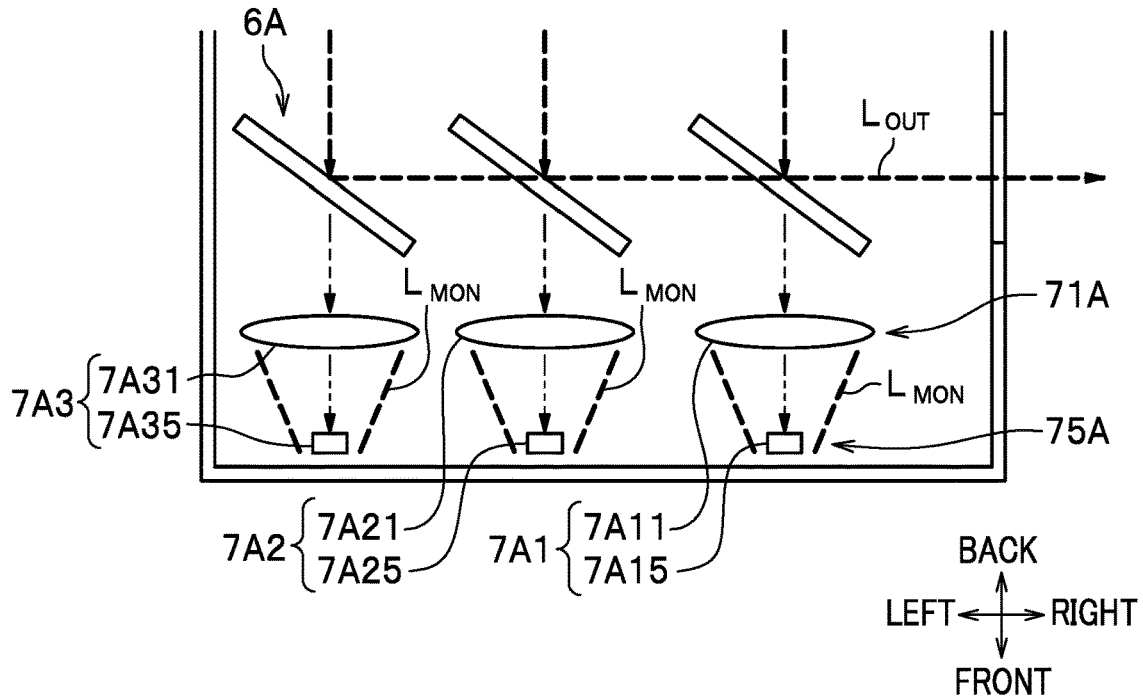
FIG. 8A is an explanatory diagram schematically illustrating a first modified example of the detection unit of the light-emitting module according to the embodiment.
Figure 8B:
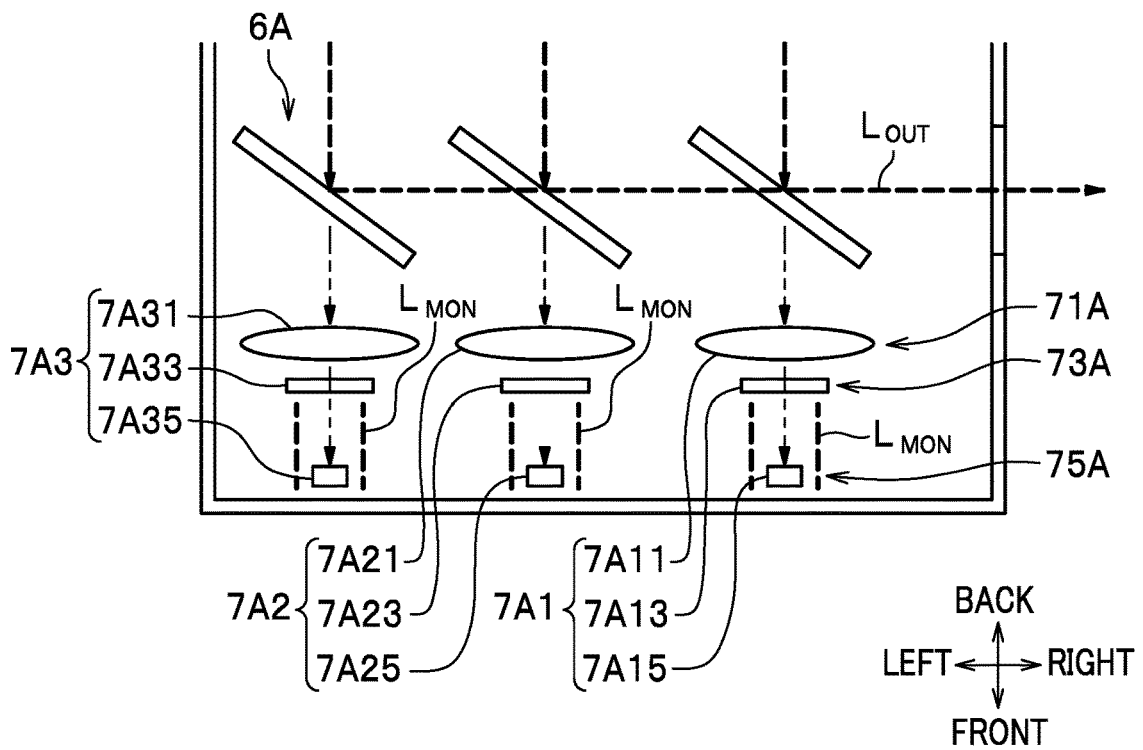
FIG. 8B is an explanatory diagram schematically illustrating a second modified example of the detection unit of the light-emitting module according to the embodiment.
Figure 8C:
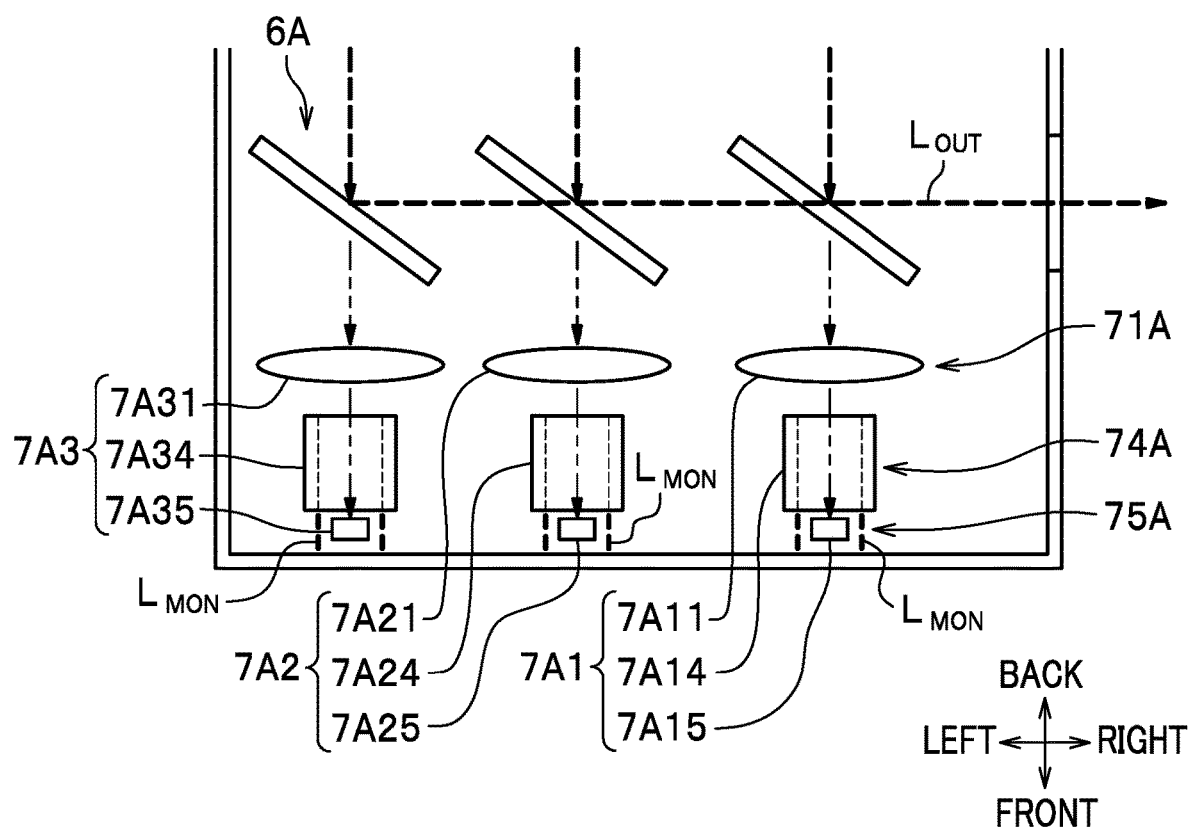
FIG. 8C is an explanatory diagram schematically illustrating a third modified example of the detection unit of the light-emitting module according to the embodiment.

The detection unit 7A may have a configuration illustrated in FIGS. 8A to 8C.

FIGS. 8A to 8C are schematic diagrams illustrating a first modified example to a third modified example of the detection unit.

As illustrated in FIG. 8A, the detection unit 7A may be configured so as to directly input the light from the first detection condensing lens 71A to the light-receiving element 75A. The light-receiving element 75A is preferably disposed such that the center of the light-receiving surface faces the optical axis of the first detection condensing lens 71A. The first detection condensing lens 71A is disposed such that a range wider than the light-receiving surface of the light-receiving element 75A is irradiated with the condensed monitor light $L_{MON}$. The light-receiving element 75A can receive the monitor light $L_{MON}$ of a center region by the light-receiving surface.

As illustrated in FIG. 8B, the detection unit 7A may have a configuration of the first detection condensing lens 71A, the diffusion plate 73A, and the light-receiving element 75A. The diffusion plate 73A is preferably disposed in a position in which the center of the diffusion plate 73A faces the optical axis of the first detection condensing lens 71A. Further, the light-receiving element 75A is preferably disposed such that the center of the light-receiving surface faces a position corresponding to the center of the diffusion plate 73A. The monitor light $L_{MON}$ transmitted from the diffusion plate 73A is output to a range wider than the light-receiving surface of the light-receiving element 75A.

As illustrated in FIG. 8C, the detection unit 7A may have a configuration of the first detection condensing lens 71A, the rod integrator 74A, and the light-receiving element 75A. As a preferable configuration, the optical axis of the first detection condensing lens 71A is positioned so as to face the center of a light-receiving surface of the rod integrator 74A. Further, the center of the rod integrator 74A is preferably positioned to face the center of the light-receiving surface of the light-receiving element 75A. A range wider than the light-receiving surface of the light-receiving element 75A is irradiated with the monitor light $L_{MON}$ output from the rod integrator 74A.

In all of the cases, the light-receiving element 75A receives the light of the monitor light $L_{MON}$ with which the light-receiving surface is irradiated, and can thus obtain information about the entire light-emitting device 2A on the light source 1A side.

The light-emitting device described in each of the embodiments can be used in a projector, lighting, a display, medical equipment such as an endoscope, and the like.

What is claimed is:

1. A light-emitting module comprising:
   a plurality of light-emitting elements located on a mounting surface;
   one or more optical members configured to control light emitted from the plurality of light-emitting elements, and allow output light and monitor light for controlling an output of the output light to exit, wherein the one or more optical members comprise a first optical member; wherein:
   the plurality of light-emitting elements comprises a plurality of first light-emitting elements, which are, among the plurality of light-emitting elements, all light-emitting elements that are configured to emit light incident on the first optical member; and
   the light-emitting module further comprises a detection unit on which the light emitted from the plurality of first light-emitting elements is incident, the detection unit comprising:
      a first condensing lens including an incident surface, which is an entirety of a surface of the first condensing lens that faces in a direction toward the plurality of first light-emitting element, wherein monitor light from the first optical member is incident on an incident region of the incident surface, and the first condensing lens is configured to condense the monitor light incident on the incident region, and
      a light-receiving element including a light-receiving surface, which is an entirety of a surface of the light-receiving element that faces in a direction toward the first condensing lens, wherein the light-receiving surface has an area smaller than an area of the incident region of the incident surface of the first condensing lens, and the light-receiving element is configured to receive monitor light exiting from the first condensing lens; and
   the plurality of first light-emitting elements, the first optical member, and the first condensing lens are configured such that the monitor light incident on the incident region of the first condensing lens comprises light obtained from light emitted from each of the plurality of first light-emitting elements.

2. The light-emitting module according to claim 1, wherein:
   the light-receiving element is configured to detect light when an amount of light incident on the light-receiving surface is equal to or greater than a threshold, and to output a detection signal in response to the detection;
   an optical axis of the first condensing lens passes through the incident region of the incident surface of the first condensing lens; and
   in a plan view in which the incident surface is viewed from an optical axis direction, of the monitor light incident on the incident surface, an amount of light incident on a region that has the same shape and the same area as a shape and an area of the light-receiving surface and that includes the optical axis of the first condensing lens is equal to or greater than the threshold.

3. The light-emitting module according to claim 1, wherein:
   when an amount of the light emitted from any one of the plurality of first light-emitting elements is increased or decreased, an amount of the monitor light exiting from the first optical member and received by the light-receiving surface also fluctuates according to the increase or the decrease.

4. The light-emitting module according to claim 1, wherein:
   the detection unit further comprises a rod integrator on which light condensed by the first condensing lens is incident; and
   the light-receiving element is configured to receive light exiting from the rod integrator.

5. The light-emitting module according to claim 4, wherein:

the rod integrator has a cross-sectional shape in which corners of a polygon of a tetragon, a pentagon, a hexagon, a heptagon, or an octagon are rounded.

6. The light-emitting module according to claim 4, further comprising:
a diffusion plate disposed between the first condensing lens and the rod integrator, and on which the monitor light emitted from the first condensing lens is incident.

7. The light-emitting module according to claim 1, further comprising:
a filter on which the monitor light exiting from the first condensing lens is incident; wherein:
the first optical member comprises a wavelength conversion member configured to emit light having a wavelength converted from the light emitted from the plurality of first light-emitting elements;
the light emitted from the plurality of first light-emitting elements and the light having the wavelength converted by the wavelength conversion member are comprised in the monitor light received by the first condensing lens;
the filter is configured to shield either the light emitted from the plurality of first light-emitting elements or the light having the wavelength converted by the wavelength conversion member, of the monitor light; and
the light-receiving element is configured to receive light passing through the filter.

8. The light-emitting module according to claim 7, wherein:
light in the monitor light obtained from the light emitted from the plurality of first light-emitting elements is the light emitted from the plurality of first light-emitting elements or the light having the wavelength converted from the light emitted from the plurality of first light-emitting elements.

9. The light-emitting module according to claim 1, wherein:
the first optical member is configured to condense the light emitted from the plurality of first light-emitting elements; and
the one or more optical members further comprise a diffusion member configured to receive the light incident on the first optical member from the first optical member and to diffuse the light as diffused light.

10. The light-emitting module according to claim 1, wherein:
the one or more optical members further comprise:
a collimating lens configured to collimate mixed light of output light and monitor light associated with the light emitted from the plurality of first light-emitting elements, and
a dichroic mirror configured to divide the mixed light being a parallel light into the output light of the parallel light and the monitor light of the parallel light.

11. The light-emitting module according to claim 1, wherein:
the first optical member comprises a wavelength conversion member configured to emit light having a wavelength converted from the light emitted from the plurality of first light-emitting elements; and
the light emitted from the plurality of first light-emitting elements and the light having the wavelength converted by the wavelength conversion member are comprised in the monitor light received by the first condensing lens.

* * * * *